(12) United States Patent
Tsui et al.

(10) Patent No.: US 12,507,436 B2
(45) Date of Patent: Dec. 23, 2025

(54) GATE FABRICATION METHOD OF AN U-METAL-OXIDE-SEMICONDUCTOR FIELD-EFFECT TRANSISTOR AND TRENCH GATE STRUCTURE FORMED THEREOF

(71) Applicant: National Yang Ming Chiao Tung University, Hsinchu (TW)

(72) Inventors: Bing-Yue Tsui, Hsinchu (TW); Li-Tien Hsueh, Taipei (TW)

(73) Assignee: NATIONAL YANG MING CHIAO TUNG UNIVERSITY, Hsinchu (TW)

( * ) Notice: Subject to any disclaimer, the term of this patent is extended or adjusted under 35 U.S.C. 154(b) by 429 days.

(21) Appl. No.: 18/107,397

(22) Filed: Feb. 8, 2023

(65) Prior Publication Data

US 2024/0105816 A1    Mar. 28, 2024

(30) Foreign Application Priority Data

Sep. 26, 2022   (TW) .................................. 111136331

(51) Int. Cl.
*H10D 30/66* (2025.01)
*H10D 30/01* (2025.01)
*H10D 64/27* (2025.01)

(52) U.S. Cl.
CPC ....... *H10D 30/668* (2025.01); *H10D 30/0297* (2025.01); *H10D 64/513* (2025.01); *H10D 64/516* (2025.01)

(58) Field of Classification Search
CPC ....... H10D 64/025–027; H10D 64/513; H10D 30/658; H10D 30/668; H10D 30/6894;

(Continued)

(56) References Cited

U.S. PATENT DOCUMENTS 4,914,058 A    4/1990   Blanchard
8,502,287 B2 *  8/2013  Radic .................. H10D 64/516
                                                 257/773

(Continued)

OTHER PUBLICATIONS

Aoki et al., "High Performance and Reliability Trench Gate Power MOSFET With Partially Thick Gate Oxide Film Structure (PTOx-TMOS)", in Proc. 18th Int. Symp. Power Semiconductor Devices IC's, (ISPSD), Jun. 4-8, 2006, pp. 85-88.

(Continued)

*Primary Examiner* — Wael M Fahmy
*Assistant Examiner* — Quinton A Brasfield
(74) *Attorney, Agent, or Firm* — Birch, Stewart, Kolasch & Birch, LLP

(57) ABSTRACT

A gate fabrication method of an UMOSFET and a trench gate structure formed thereof are provided, comprising providing a transistor structure and a lithography process is employed to define a trench region. A gate oxide layer is deposited along the trench and two polysilicon sidewalls having a spacing there in between are formed afterwards. A wet etching is used to remove the gate oxide layer underneath the polysilicon sidewalls such that a vacancy is formed at the trench bottom. By oxidizing the polysilicon sidewalls, a thick oxide layer is formed, enfolding periphery of the polysilicon sidewalls and filling the vacancy. The spacing can be alternatively retained between the polysilicon sidewalls covered with the thick oxide layer, such that the trench can be alternatively filled. The present invention is effective in increasing oxide thickness of the gate bottom, reducing the trench corner curvature as well as the feedback capacitance.

22 Claims, 14 Drawing Sheets

(58) Field of Classification Search
CPC .. H10D 30/699; H01L 21/0223–02244; H01L 21/02323; H01L 21/3165; H01L 21/31654; H01L 21/31658; H01L 21/31675; H01L 21/32105; H01L 21/76202–76221; H01L 21/76232–76235; H01L 21/76855; H01L 21/76888
See application file for complete search history.

(56) References Cited

U.S. PATENT DOCUMENTS

| | | | | |
|---|---|---|---|---|
| 8,735,978 | B2* | 5/2014 | Radic | H10D 64/516 |
| | | | | 257/288 |
| 10,600,911 | B2* | 3/2020 | Grote | H10D 64/513 |
| 2006/0008991 | A1* | 1/2006 | Hijzen | H10D 8/60 |
| | | | | 257/E29.136 |
| 2010/0171171 | A1* | 7/2010 | Hsu | H10D 30/0297 |
| | | | | 438/270 |
| 2015/0380538 | A1* | 12/2015 | Ogawa | H10D 64/117 |
| | | | | 257/144 |
| 2022/0148923 | A1* | 5/2022 | Tsui | H10D 12/031 |

OTHER PUBLICATIONS

Harada et al., "3.3-kV-Class 4H—SiC MeV-Implanted UMOSFET With Reduced Gate Oxide Field", IEEE Electron Device Letters, vol. 37, No. 3, Mar. 2016, pp. 314-316.

Kojima et al., "Self-aligned formation of the trench bottom shielding region in 4H—SiC trench gate MOSFET", J. J. Appl. Phys., vol. 55, 04ER02, 2016, pp. 04ER02-1-04ER02-4.

Nakamura et al., "High Performance SiC Trench Devices with Ultra-low Ron", in Proc. IEEE Int. Electron Devices Meeting (IEDM), 2011, pp. 599-601.

Saitoh et al., "4H—SiC V-Groove Trench MOSFETs with the Buried p$^+$ Regions", SEI Technical Review, No. 80, Apr. 2015, pp. 75-80.

Takaya et al., "A 4H—SiC Trench MOSFET with Thick Bottom Oxide for Improving Characteristics", in Proc. 25th Int. Symp. Power Semiconductor Devices IC's, (ISPSD), 2013, pp. 43-46.

Yen et al., "A Novel Process to Fabricate 4H—SiC UMOSFET with Thick Bottom Oxide (TBOX) at Trench Bottom", presented in the International Electron Devices and Materials Symposia (IEDMS) 2019, Oral A3-4.

* cited by examiner

GATE FABRICATION METHOD OF AN U-METAL-OXIDE-SEMICONDUCTOR FIELD-EFFECT TRANSISTOR AND TRENCH GATE STRUCTURE FORMED THEREOF

This application claims priority of Application No. 111136331 filed in Taiwan on 26 Sep. 2022 under 35 U.S.C. § 119; the entire contents of all of which are hereby incorporated by reference.

BACKGROUND OF THE INVENTION

Field of the Invention

The present invention relates to gate process fabrication techniques. More particularly, the present invention is related to a gate fabrication method of an U-metal-oxide-semiconductor field-effect transistor, in which by oxidizing polysilicon sidewalls, the oxide thickness of the gate bottom can be significantly increased.

Description of the Prior Art

As known, an U-metal-oxide-semiconductor field-effect transistor (UMOSFET) is a kind of high-voltage metal-oxide-semiconductor field-effect transistor (HV MOSFET) which has small cell pitch, and thus makes an UMOSFET a semiconductor device with the low specific on-resistance. Please refer to FIG. 1, which shows a schematic diagram of a basic structure of a conventional N-type UMOSFET in the prior art. As shown, when a gate voltage is applied to the gate 10 and the gate voltage is sufficient to produce an inversion layer at the interface between the p-type body region (illustrated as "P-body" in the figure) 12 and the gate oxide layer 13, that is, the gate voltage is greater than a threshold voltage for the transistor to conduct, under such condition, electrons will flow from the N+ source 14 in the upper place into the channel of the inversion layer, then enter the N− drift region 15 and finally reach the N+ drain 16 at its back end. In general, in order to form a complete channel, the trench depth of the gate 10 must exceed the P-body 12 and enter the N-drift region 15.

In view of the trending developments of the existing technologies, since silicon carbide (SiC) has a wider bandgap and a higher breakdown voltage than silicon does, the UMOSFET which is made of silicon carbide, comparatively sustain ten times as large breakdown strength as the UMOSFET which is made of silicon does. Therefore, it achieves to sustain grandly high breakdown voltages with low impedance and thin drift layer. However, it draws our attention that, when a large voltage is applied to the drain, the effect of electric field crowding often occurs on both sides of its gate bottom of the transistor due to less radius of curvature on both sides of the gate bottom. As such, it affects the breakdown voltages and lowers the breakdown voltages. In addition, for SiC devices, the wafer usually takes the (0001) crystal plane as its commonly used front side, and the (11-20) crystal plane as its trench sidewall. Normally, the electron mobility along the (11-20) crystal plane will be much higher than the electron mobility along the (0001) crystal plane, so that the transistor can have a lower on-resistance. Nevertheless, it is known that the thermal oxidation rate of the (0001) crystal plane is much lower than that of the (11-20) crystal plane. If the gate oxide layer of the transistor is formed by thermal oxidation, the thickness at the trench bottom will be thinner than the thickness at its sidewall. Moreover, when taking the electric field crowding and enhancement effect at the corners on both sides of the trench bottom into considerations, then it is apparent that, the transistor will be very likely to fail due to its gate oxide breakdown. So far, there have been related technologies being proposed, which perform to control the chemical vapor deposition (CVD) process parameters so as to make the deposition rate on the sidewall less than the deposition rate on its bottom. By doing so, the bottom oxide layer can be controlled to be thicker than the sidewalls. However, the electric field crowding and enhancement effect at the corners on both sides of the trench bottom still cannot be avoided, so the breakdown voltage of the transistor is still limited by breakdown of its gate oxide layer.

Based on these issues to be solved, another prior art, as indicated in FIG. 2, proposes to use and dispose a P-type region 31 in the N− drift region 30, which is configured to be close to the bottom of the gate 32, and thus forms a depletion area by the p-n junction to deplete the trench bottom for reducing the electric field of the gate oxide layer. However, when the transistor is turned on, the depletion area formed by the p-n junction will also be an obstacle to its current flow, causing the junction gate field-effect transistor (JFET) effect, thereby increasing the on-resistance of the device accordingly. Therefore, such method still has unavoidable issues to be solved. And yet, another prior art proposes to use a silicon dioxide to fill the trench first, after the trench is formed by etching. Afterwards, a chemical mechanical polishing (CMP) process is then employed to remove the silicon dioxide, which is located outside the trench. Later, for the remaining silicon dioxide, which is located in the trench, a dry etching process is employed to etch the silicon dioxide in the trench, and merely leaves silicon dioxide of expected thickness as required. However, such method must be involved with a high-cost CMP process. Moreover, the thickness of the oxide layer at the bottom of the trench is also difficult to control precisely, and thus, cannot be brought into actual mass production stage.

And yet, another prior art proposes to use ion implantation to make amorphous silicon carbide at the bottom of the trench so as to increase its oxidation rate, and hopefully, to grow a thicker oxide layer by thermal oxidation. However, it is still worth noticing that the oxidation temperature of such method is lower than the temperature required for the recrystallization of the silicon carbide. Therefore, it is very likely that defects will remain in the device structure and affect the performance of the device. As a result, it is believed that such method still fails to be practically applied.

And moreover, regarding an U-metal-oxide-semiconductor field-effect transistor (UMOSFET), since it is known that its trench gate bottom overlaps with the drain, forming a parasitic gate-drain capacitance ($C_{GD}$), also known as the feedback capacitance or the reverse transfer capacitance ($C_{rss}$), such parasitic gate-drain capacitance is a key factor to affect the transistor switching speed and switching power consumption. Among the above-mentioned techniques involving with providing depletion area or increasing the oxide layer thickness at the trench bottom for protecting the gate oxide layer, although it can be found to reduce the parasitic gate-drain capacitance, nevertheless, a much lower parasitic gate-drain capacitance is still to be expected for the current UMOSFETs.

Therefore, on account of above, to overcome the above-mentioned problems, it should be obvious that there is indeed an urgent need for the professionals in the field for proposing a new process method to be developed that can effectively solve the above-mentioned problems occurring in the prior design. And by using such process method, the oxide thickness at the trench gate bottom of an UMOSFET can be effectively increased and the parasitic gate-drain capacitance $C_{GD}$ can be reduce at the same time. As a result, it is believed that those long-standing shortcomings in the prior arts can be successfully solved. Hereinafter, the detailed specific implementations will be fully described in the following paragraphs.

SUMMARY OF THE INVENTION

In order to overcome the above-mentioned disadvantages, one major objective in accordance with the present invention is to provide a gate fabrication method of an U-metal-oxide-semiconductor field-effect transistor (UMOSFET). By employing the disclosed gate fabrication method of the present invention in which the polysilicon is oxidized due to a thermal oxidation process, it achieves in effectively increasing the oxide thickness at the bottom of the gate region. Meanwhile, the curvature of the trench corner can be reduced at the same time. Given that the same voltage is applied to the device, it is believed that the electric field intensity of the device is reduced, thereby enhancing the breakdown voltages of the device.

And another major objective in accordance with the present invention is also to provide a gate fabrication method of an UMOSFET and a trench gate structure formed by using the gate fabrication method. The present invention proposes to provide two polysilicon sidewalls which are disposed on two opposite sidewalls of the trench, such that a spacing is formed in the gate region and the trench is only partially filled by the polysilicon. Due to such technical features, the gate and drain regions of the trench gate structure formed by the present invention have less overlap area. As such, the parasitic gate-drain capacitance ($C_{GD}$) can be effectively reduced.

For achieving the above mentioned objectives, the technical solutions of the present invention are aimed to provide a gate fabrication method of an UMOSFET, comprising following steps.

(a): a semiconductor substrate is provided first, and a drift region is formed on the semiconductor substrate.

(b): a first heavily doped region is formed in the drift region afterwards. Regarding such step, a source ion implantation process may be adopted so as to form the first heavily doped region in the drift region.

(c): later, a second heavily doped region and a third heavily doped region are respectively formed on opposite sides of the first heavily doped region. And a body region is further formed between the first heavily doped region, the second heavily doped region, the third heavily doped region and the drift region.

(d): and then, a hard mask layer is deposited on the first heavily doped region, the second heavily doped region and the third heavily doped region, and a lithography process is then used to form a trench. According to the embodiment of the present invention, the trench extends through the first heavily doped region and the body region, and the bottom of the trench ends in the drift region.

In one embodiment of the present invention, the hard mask layer is made of silicon dioxide ($SiO_2$).

(e): subsequently, a gate oxide layer is deposited along the trench, such that the gate oxide layer covers at least two opposite sidewalls and a bottom of the trench. According to one embodiment of the present invention, a plasma enhanced chemical vapor deposition (PECVD) process, for instance, can be preferably used to deposit the gate oxide layer. When the gate oxide layer is formed by employing a PECVD process, it can be obtained that a thickness of the gate oxide layer which covers the bottom of the trench is twice as thick as a thickness of the gate oxide layer which covers the sidewall of the trench.

(f): after the gate oxide layer is deposited, the present invention proceeds to form two polysilicon sidewalls on the two opposite sidewalls of the trench. Specifically, the two polysilicon sidewalls cover the gate oxide layer on the two opposite sidewalls and also cover the gate oxide layer on the bottom of the trench. Each of the two polysilicon sidewalls is disposed corresponding to each of the two opposite sidewalls of the trench, and a first spacing is formed between the two polysilicon sidewalls.

In one embodiment of the present invention, when forming the two polysilicon sidewalls, a plurality of process steps provided as follows, may be adopted for forming the polysilicon sidewalls which has the first spacing there in between:

(f-1): a low-pressure chemical vapor deposition (LPCVD) process can be used first to deposit a polysilicon; and (f-2): an anisotropic etching process can be subsequently employed to etch the polysilicon, such that the two polysilicon sidewalls having the first spacing there in between can be formed.

According to the embodiment of the present invention, in order to retain a sufficient width of the first spacing between the two polysilicon sidewalls, the thickness of one polysilicon sidewall should be less than half a width of the trench. For instance, according to one embodiment of the present invention, the thickness of one polysilicon sidewall is controlled to be in a range between 0.2 µm and 1.0 µm.

(g): after that, the present invention proceeds to remove the gate oxide layer underneath the two polysilicon sidewalls such that the two polysilicon sidewalls are dangling, and a vacancy is formed at the bottom of the trench. To be more specific, the present invention may further comprises using a wet etching involving with buffer oxide etch (BOE) process for the purpose of removing the gate oxide layer underneath the two polysilicon sidewalls such that the vacancy at the bottom of the trench can be successfully formed.

(h): and next on, after the gate oxide layer underneath the two polysilicon sidewalls is removed and the vacancy is formed, the present invention proceeds to perform a thermal oxidation process such that a thick oxide layer is formed after the two polysilicon sidewalls are oxidized. In view of the disclosed thermal oxidation process, it is provided that oxygen ($O_2$), water molecule ($H_2O$), or a mixture of hydrogen ($H_2$) and oxygen ($O_2$) can be alternatively used in the thermal oxidation process for oxidizing the polysilicon sidewalls. According to one embodiment of the present invention, the thick oxide layer formed by the thermal oxidation process may have a thickness between 0.1 µm and 0.5 µm. Preferably, the thickness of the thick oxide layer can be 0.3 µm. In general, various modifications and variations to the present invention can be made by people who are skilled in the art, without departing from the scope or spirits of the invention. And yet, the present invention covers these modifications and/or variations provided that, they fall within the scope of the invention and its equivalent. The present invention is certainly not limited to the disclosed parameters and conditions as illustrated above.

As a result, due to the thermal oxidation process performed in the present invention, the formed thick oxide layer enfolds a periphery of the two polysilicon sidewalls and fills the vacancy at the bottom of the trench. In addition, a second spacing is formed between the two polysilicon sidewalls enfolded by the thick oxide layer such that the trench is partially filled.

According to the embodiment of the present invention, it is apparent that a width of the second spacing is less than that of the first spacing.

On account of the technical results, it is derived that based on the gate fabrication method disclosed in the present invention, it is aimed to provide the polysilicon sidewalls which are disposed on two opposite sidewalls of the trench, such that a spacing is formed in the gate region and thus the trench is only partially filled by the polysilicon. Meanwhile, the gate and drain regions of the trench gate structure formed by the present invention have less overlap area. As a result, it is believed that the parasitic gate-drain capacitance ($C_{GD}$) can be effectively reduced. Apart from above, due to the oxidation of the polysilicon sidewalls, it is also obtained that an oxide thickness at the gate bottom can be greatly increased, and the curvature of the trench corner can be accordingly reduced as well.

And yet furthermore, considering the former step (h) in which the thermal oxidation process is performed, the present invention alternatively proposes to continue for performing the thermal oxidation process such that the thick oxide layer continues to grow. Under such a circumstance, it can be obtained that the second spacing will be eventually vanished and the trench will be completely filled. According to such a variant embodiment, as long as the thick oxide layer underneath the polysilicon keeps growing and becomes thick enough to fill the vacancy at the bottom of the trench, then it is also applicable to continue growing the thick oxide layer such that the foregoing second spacing is vanished. The disclosed process method of the present invention is not limited thereto.

In addition, the present invention, in another aspect, also provides a trench gate structure formed by using the gate fabrication method of an U-metal-oxide-semiconductor field-effect transistor (UMOSFET) of the application. The proposed trench gate structure comprises a trench gate and the thick oxide layer. The trench gate is formed in the trench and includes the two polysilicon sidewalls, wherein the above-mentioned first spacing exists between the two polysilicon sidewalls before the thermal oxidation process is performed. The thick oxide layer enfolds the periphery of the two polysilicon sidewalls and fills the bottom of the trench. In addition, the above-mentioned second spacing can be alternatively retained between the two polysilicon sidewalls enfolded by the thick oxide layer such that the trench can be partially filled. Optionally, when the second spacing is vanished as the thick oxide layer keeps growing, the trench can be completely filled. Either of the above-mentioned embodiments can be utilized for implementation of the inventive effects of the present invention.

Moreover, according to one preferable embodiment of the present invention, the material of the semiconductor substrate used in the present invention may be, for example, a silicon carbide (SiC) substrate. However, the process method and the trench gate structure formed therein the present invention are not limited to the disclosed silicon carbide material. Based on the same design manners, it is believed that the technical solutions disclosed in the present invention can also be widely applied to other semiconductor materials. For example, the material of the semiconductor substrate can also be made of silicon (Si), gallium oxide ($Ga_2O_3$), aluminum nitride (AlN), diamond, and so on. Besides, the types of transistors that the present invention can be applied to are not limited to transistors with N-type channels. It may also be applied to transistors with P-type channels. In other words, according to the process method disclosed in the present invention and the trench gate structure formed thereof, the semiconductor substrate, the drift region, and the first heavily doped region used, have a first semiconductor type. And the second heavily doped region, the third heavily doped region and the body region have a second semiconductor type. The first semiconductor type and the second semiconductor type are opposite conductivity types.

And furthermore, in view of the filed application of the present invention, it is believed that its application field is not limited to the above-mentioned UMOSFETs. According to a plurality of variant embodiments of the present invention, it can alternatively be further widely applied to any power device which includes the UMOSFET structure, for example, an Insulated Gate Bipolar Transistor (IGBT). As a matter of fact, it is apparent that the present invention shows superior industrial applicability and technical compatibility.

Based on the above, a gate fabrication method of an U-metal-oxide-semiconductor field-effect transistor (UMOSFET) and its trench gate structure formed thereof are provided. According to the disclosed process techniques, the gate oxide layer is deposited along the sidewalls and bottom of the trench first. After that, polysilicon sidewalls are provided and cover thereon the gate oxide layer and the sidewalls of the trench. A first spacing is retained there in between the polysilicon sidewalls. Later, by removing the gate oxide layer which is disposed underneath the polysilicon sidewalls, the polysilicon sidewalls are dangling and a vacancy is formed at the bottom of the trench. A thermal oxidation process is subsequently employed to oxidize the polysilicon sidewalls, such that a thick oxide layer is formed. The formed thick oxide layer enfolds a periphery of the polysilicon sidewalls and fills the vacancy at the bottom of the trench. Meanwhile, a second spacing can be alternatively retained between the polysilicon sidewalls enfolded by the thick oxide layer such that the trench can be partially or completely filled. Regardless of the second spacing to be retained or not, it is believed that by employing the disclosed technical process method, the present invention achieves in reducing the overlap area of the gate and drain regions, so as to decrease the parasitic gate-drain capacitance ($C_{GD}$).

In another aspect of the advantages, the present invention also achieves in increasing the oxide layer thickness at the gate bottom. Therefore, the trench corner curvature can be effectively reduced, whereby breakdown voltages and reliability of the power device when adopting the present invention can be significantly improved.

It is worth emphasizing that, the embodiments disclosed in the present invention are merely described as taking silicon carbide as an illustrative exemplary example. The purpose is to enable those skilled in the art to fully understand the technical spirits of the present invention, but not intend to limit the application of the present invention. In other words, the process method disclosed in the present invention can be applied not only to silicon carbide substrates, but also to various semiconductor materials. The process method provided by the present invention can also be further applied to various semiconductor materials, and not limited to silicon carbide substrates.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
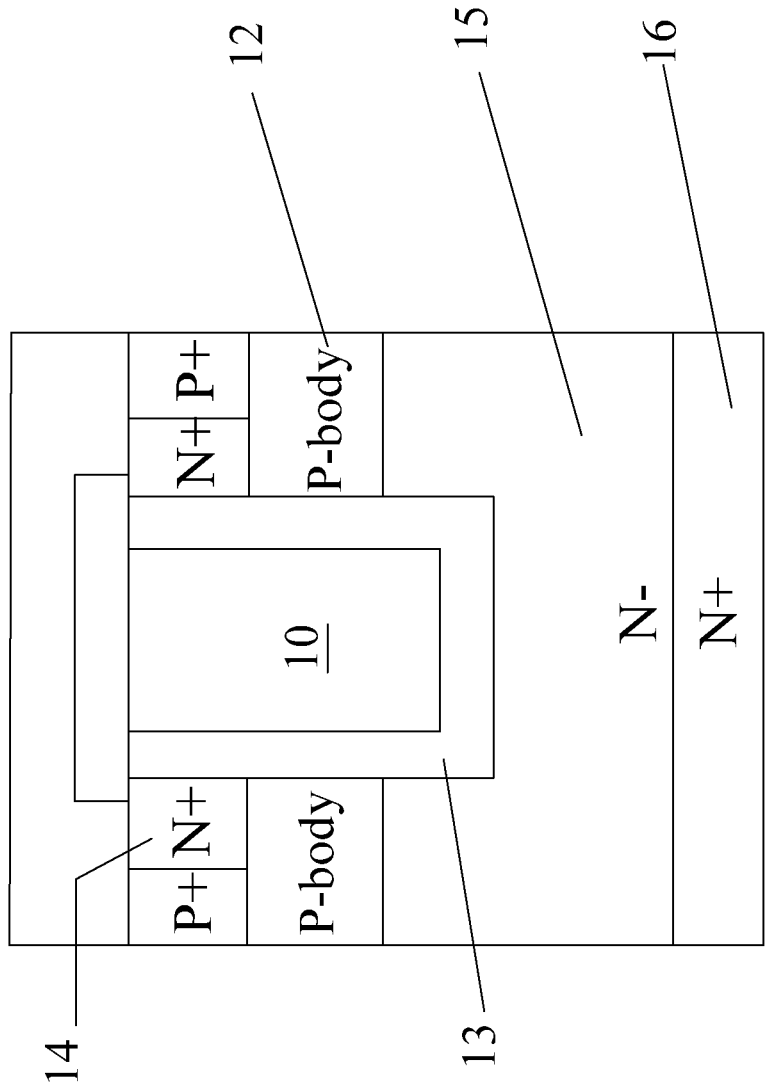
FIG. 1 shows a schematic structural diagram of a basic structure of a conventional N-type UMOSFET in the prior art.
Figure 2:
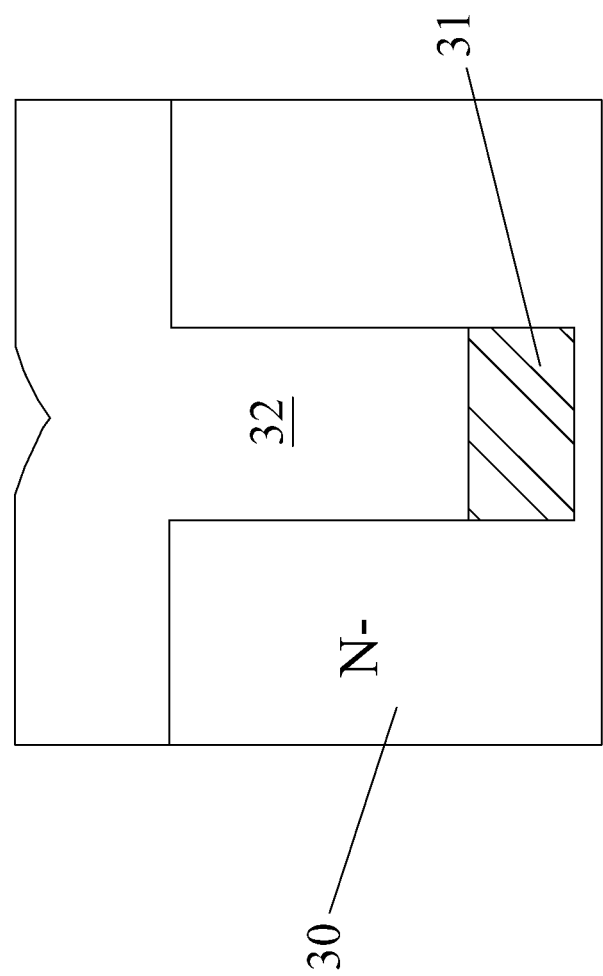
FIG. 2 shows a schematic structural diagram of disposing a P-type region in the bottom of the gate of an UMOSFET in the prior art.

It is to be understood that both the foregoing general description and the following detailed description are exemplary and are intended to provide further explanation of the invention as claimed.

Reference will now be made in detail to the preferred embodiments of the present invention, examples of which are illustrated in the accompanying drawings. Wherever possible, the same reference numbers are used in the drawings and the description to refer to the same or like parts.

The embodiments described below are illustrated to demonstrate the technical contents and characteristics of the present invention and to enable the persons skilled in the art to understand, make, and use the present invention. However, it shall be noticed that, it is not intended to limit the scope of the present invention. Therefore, any equivalent modification or variation according to the spirit of the present invention is to be also included within the scope of the present invention.

Figure 3:
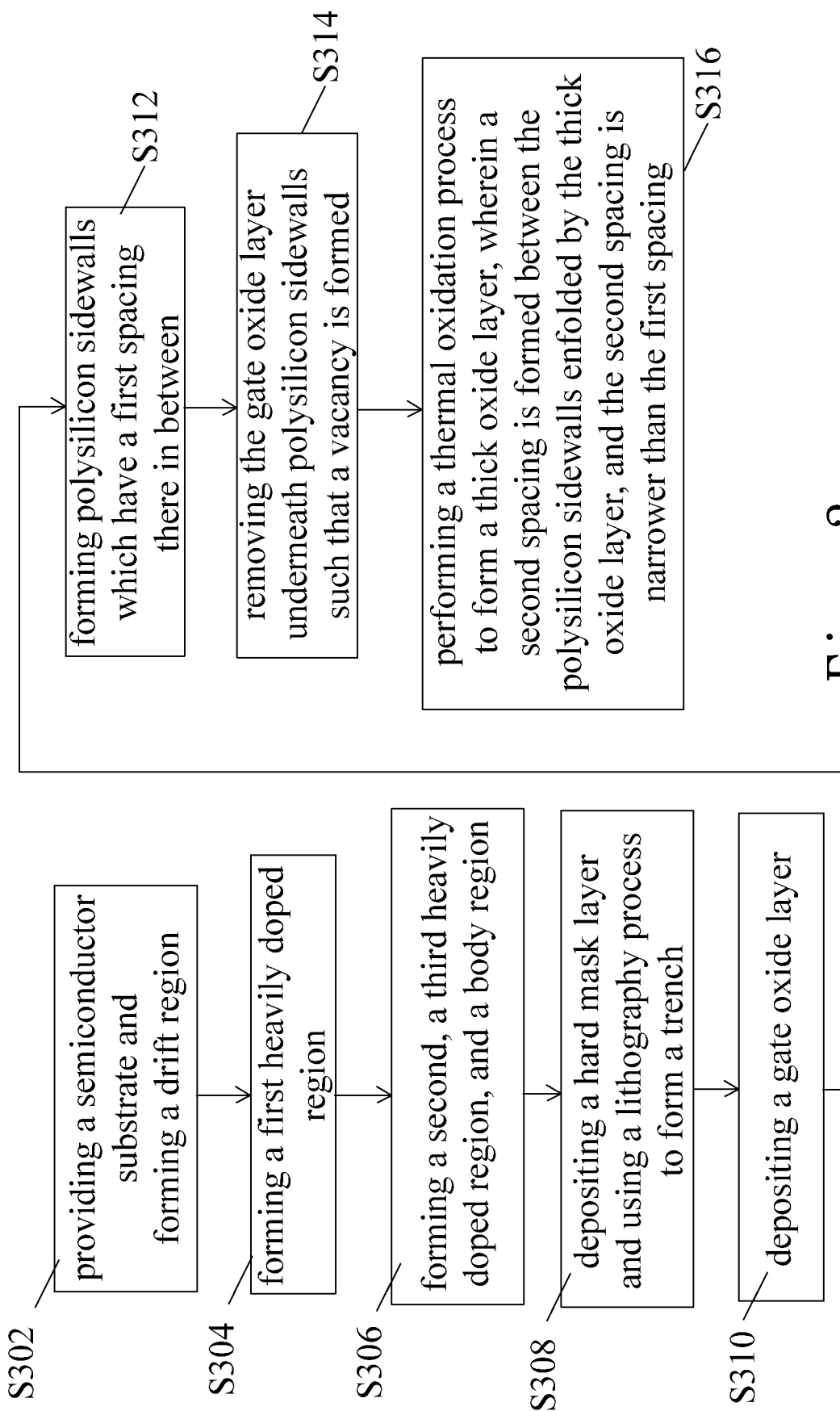
FIG. 3 shows a flow chart illustrating the steps of the gate fabrication method of an UMOSFET in accordance with one embodiment of the present invention.
Figure 4:
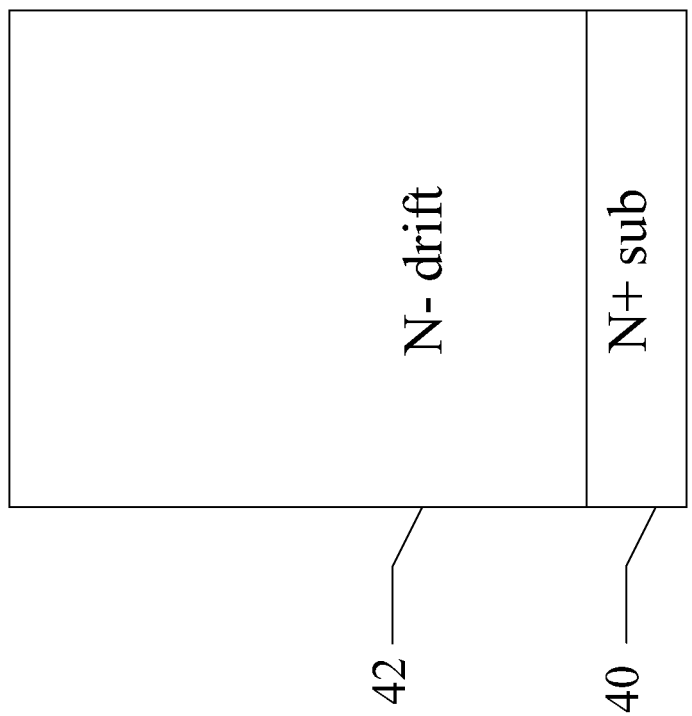
FIG. 4 shows a schematic structural diagram of forming an N-type drift region on an N-type semiconductor substrate in accordance with one embodiment of the present invention.

Please refer to FIG. 3, which shows a flow chart illustrating the steps of the gate fabrication method of an U-metal-oxide-semiconductor field-effect transistor (UMOSFET) in accordance with one embodiment of the present invention. The proposed gate fabrication method includes the steps of S302, S304, S306, S308, S310, S312, S314 and S316. By adopting the proposed gate fabrication method of an UMOSFET disclosed in the present invention, it is effective in increasing an oxide thickness at the bottom of the trench gate, meanwhile reducing the corner curvature of the trench. For illustrating the proposed gate fabrication method of the present invention, please refer to FIG. 4 to FIG. 12, which accompanying show schematic cross-sectional views of the structure of an UMOSFET by employing the proposed method disclosed in the present invention. First, as referring to the step of S302 in FIG. 3, please find FIG. 4, in which a semiconductor substrate 40 is provided. In such step, according to one embodiment of the present invention, the semiconductor substrate 40 preferably, can be made of an N-type silicon carbide (SiC). In FIG. 4, it is illustrated as an N-type heavily doped substrate (N+ sub) 40. Afterwards, a drift region 42 is formed on the semiconductor substrate 40. According to the embodiment of the present invention, an N-type silicon carbide epitaxial layer with a doping concentration of $1\times10^{16}$ cm$^{-3}$ and a thickness of 5.5 μm can be grown on the front side of the N+ heavily doped substrate (N+ sub) as the N− drift region (shown as N− drift) 42 by epitaxial growth, so as to form the structure as shown in FIG. 4.

Figure 5:
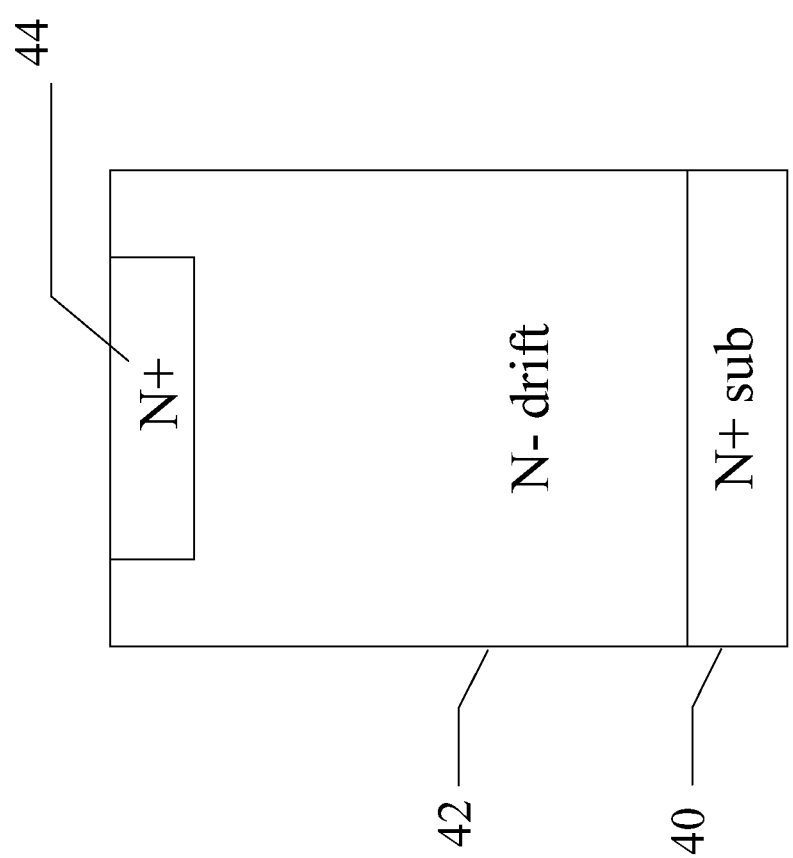
FIG. 5 shows a schematic structural diagram from FIG. 4 after the source ion implantation process is performed.

And subsequently, as referring to the step of S304 in FIG. 3, please find FIG. 5, in which a first heavily doped region 44 is formed in the drift region 42. Specifically, after the previous step is complete, the present invention proceeds to perform an RCA cleaning first. Then, silicon dioxide is deposited as a barrier layer, and a lithography process is employed to define an N+ source window. Subsequently, after the source ion implantation, the silicon dioxide barrier layer is removed and the first heavily doped region 44 as shown in FIG. 5, can be formed. In other words, according to the embodiment of the present invention, when regarding forming the first heavily doped region 44 in the drift region 42, it is feasible to use a source ion implantation process for forming the disclosed first heavily doped region 44. According to the embodiment of the present invention, since the N-type silicon carbide material is used as an exemplary example for detailed descriptions, as can be seen in the relevant figures, the first heavily doped region 44 will be illustrated as the N-type heavily doped region (N+).

Figure 6:
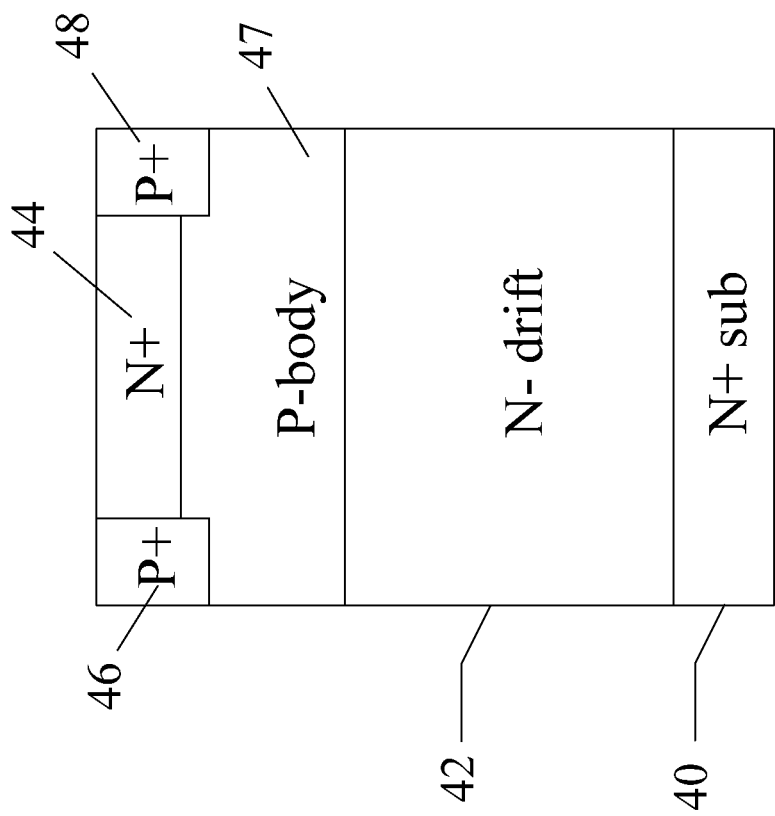
FIG. 6 shows a schematic structural diagram from FIG. 5, in which a P-body and P-type heavily doped regions are further formed therein.

After that, as referring to the step of S306 in FIG. 3, please find FIG. 6, in which the RCA cleaning is performed repeatedly, and definition of the P-type heavily doped region (P+) and ion implantation process are employed for forming a second heavily doped region 46 (shown as "P+" in the figures) and a third heavily doped region 48 (shown as "P+" in the figures) respectively on opposite sides of the first heavily doped region 44 (shown as "N+" in the figures). Later, the silicon dioxide is deposited again as the barrier layer and a lithography process is carried out to define a P-type body region window. A body ion implantation process is then performed, and the silicon dioxide barrier layer is removed such that the body region 47 (shown as "P-body" in the figures) can be formed between the first heavily doped region 44, the second heavily doped region 46, the third heavily doped region 48 and the drift region 42. The structure as illustrated in FIG. 6 is thus obtained.

Figure 7:
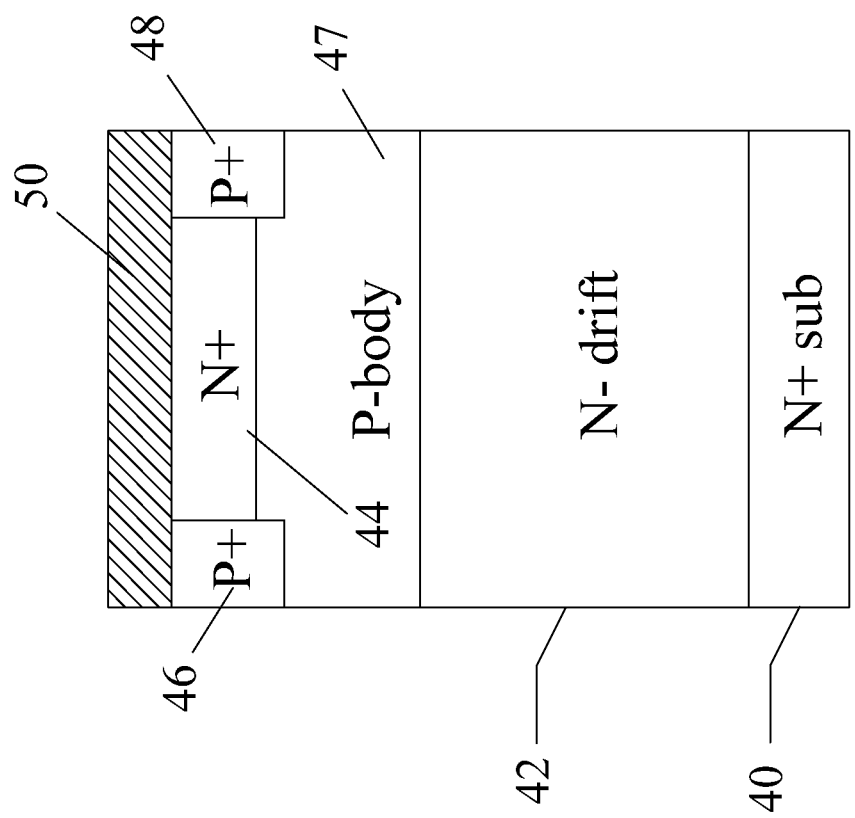
FIG. 7 shows a schematic structural diagram from FIG. 6, in which a silicon dioxide hard mask layer is further deposited.
Figure 8:
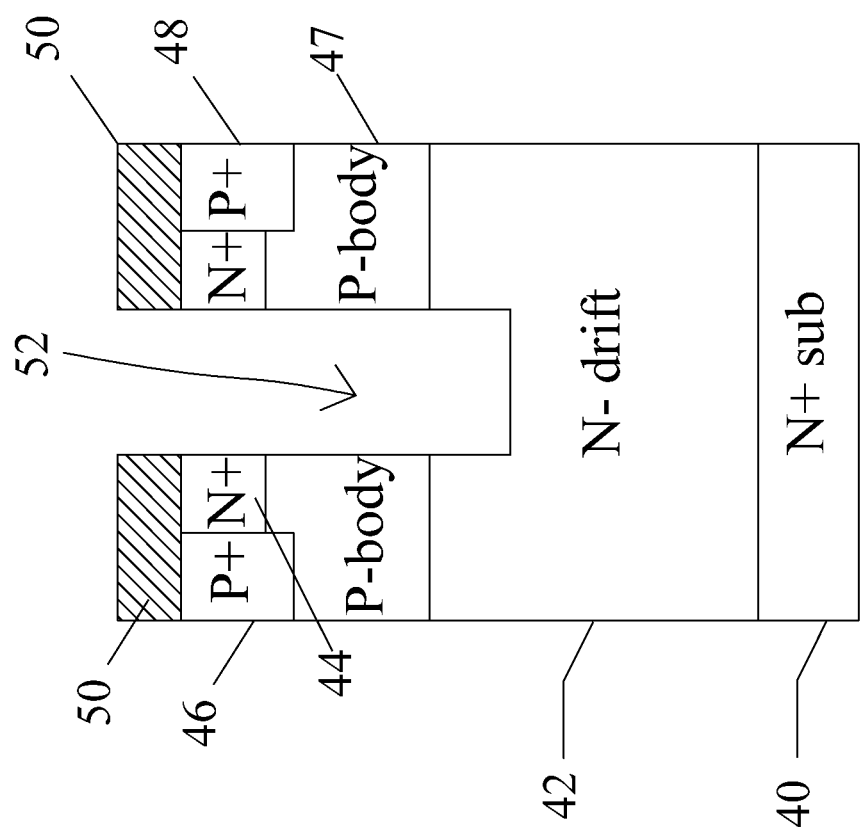
FIG. 8 shows a schematic structural diagram from FIG. 7 after a lithography process is further employed to define a trench region.

Next, as referring to the step of S308 in FIG. 3, a hard mask layer is subsequently deposited on the above-mentioned first heavily doped region 44, the above-mentioned second heavily doped region 46 and the above-mentioned third heavily doped region 48. And a lithography process is used to form a trench. To be specific, please refer to the structure as shown in FIG. 7, in which the hard mask layer 50 is deposited and shown as a slashed area. According to the embodiment of the present invention, the hard mask layer 50, for instance, can be made of silicon dioxide ($SiO_2$) as an etch-stop barrier layer for the transistor trench gate region. As can be seen, the hard mask layer 50 is deposited on the first heavily doped region (N+) 44, the second heavily doped region (P+) 46 and the third heavily doped region (P+) 48. And afterwards, please refer to the structure as shown in FIG. 8, the present invention proceeds to adopt a lithography process for defining a trench region of the transistor, such that the trench 52 as illustrated in FIG. 8 can be obtained.

According to the embodiment of the present invention, the disclosed trench 52 extends through the first heavily doped region (N+) 44 and the body region (P-body) 47, and the bottom of the trench 52 ends in the drift region (N− drift) 42.

Figure 9:
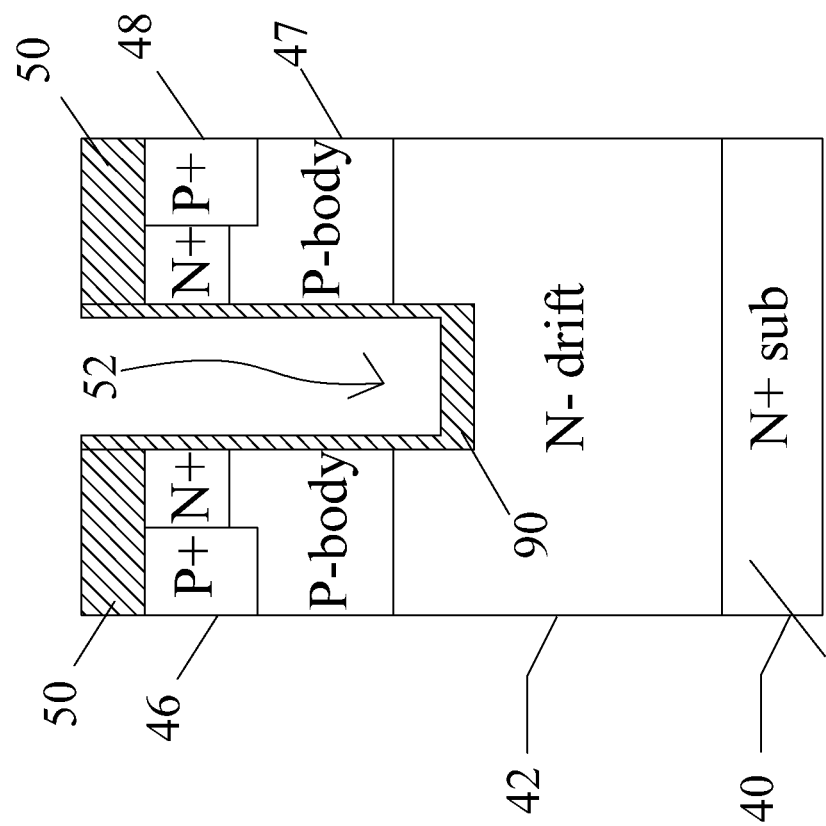
FIG. 9 shows a schematic structural diagram from FIG. 8 after a gate oxide layer is formed.

Hereinafter, as referring to the step of S310 in FIG. 3, the present invention is able to perform for depositing a gate oxide layer along the trench 52, such that the gate oxide layer covers at least two opposite sidewalls and a bottom of the trench 52. For a detailed view of the structure, please find FIG. 9 of the present invention. As can be seen in the figure, the gate oxide layer 90 covers at least two opposite sidewalls and a bottom of the trench 52. Regarding a practical application, according to one embodiment of the present invention, when the gate oxide layer 90 is formed by using a low-pressure CVD (LPCVD) process, then a bottom thickness of the gate oxide layer 90 will approximately equal to its sidewall thickness. However, in an alternative embodiment, when the gate oxide layer 90 is formed by using a plasma enhanced chemical vapor deposition (PECVD) process instead, then a bottom thickness of the gate oxide layer 90 can be approximately 1.5-2 times as thick as its sidewall thickness. That is to say, according to the structure as shown in FIG. 9, the thickness of the gate oxide layer 90 which covers the bottom of the trench 52 can be twice as thick as the thickness of the gate oxide layer 90 which covers the sidewall of the trench 52.

Therefore, when regarding performing the step of S310, it is believed that a PECVD process is preferably used for forming and depositing the gate oxide layer 90 according to the technical manners of present invention.

As a result, after the above-mentioned gate oxide layer 90 is formed along with adequate passivation to improve the gate oxide quality, the step of S312 in FIG. 3 can thus be carried out: forming two polysilicon sidewalls, each on one sidewall of the trench, and the two polysilicon sidewalls have a spacing there in between. Please refer to the accompanying drawing in FIG. 10, in which the two polysilicon sidewalls 100 are disposed and configured on the two opposite sidewalls of the trench 52 which is covered with the previously formed gate oxide layer 90. Each polysilicon sidewall 100 is disposed corresponding to each sidewall of the trench 52. The two polysilicon sidewalls 100 cover the gate oxide layer 90 on the two opposite sidewalls and also cover the gate oxide layer 90 on the bottom of the trench 52. According to the embodiment of the present invention, it can be seen that, a first spacing 111 is formed between the two polysilicon sidewalls 100 in the first place.

In a practical application, when regarding forming the polysilicon sidewalls 100 in the step of S312, the present invention is able to adopt a low-pressure chemical vapor deposition (LPCVD) process to deposit a polysilicon first. And after that, an anisotropic etching process can be performed to etch the polysilicon so as to form the proposed two polysilicon sidewalls 100 having the first spacing 111 there in between. In general, in order to retain a sufficient width of the first spacing 111 between the two polysilicon sidewalls 100, the thickness of one polysilicon sidewall 100 should be less than half a width of the trench 52. For instance, according to one embodiment of the present invention, the thickness of one polysilicon sidewall 100 is controlled to be in a range between 0.2 μm and 1.0 μm.

Figure 11:
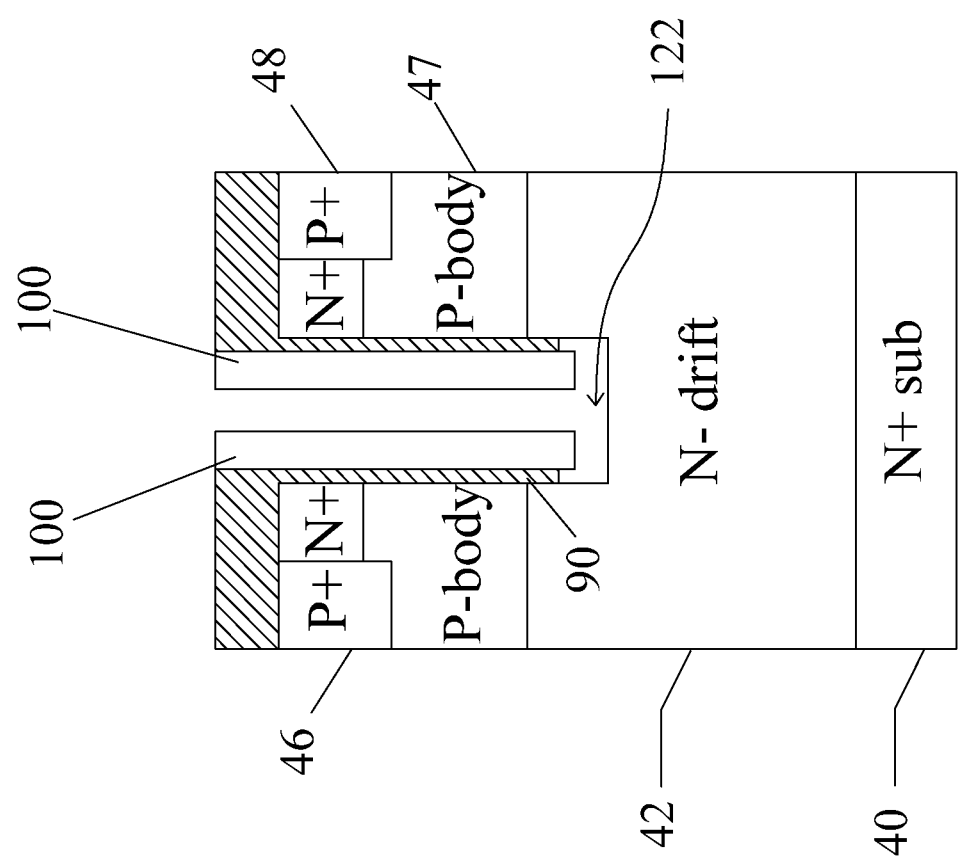
FIG. 11 shows a schematic structural diagram from FIG. 10, in which the gate oxide layer underneath the polysilicon sidewalls is removed to form a vacancy at the bottom of the trench.

And then, as referring to the step of S314 in FIG. 3, the present invention is able to perform for removing the gate oxide layer 90 underneath the polysilicon sidewalls 100. As shown in FIG. 11, therefore, it is apparent that after the gate oxide layer 90 underneath the polysilicon sidewalls 100 is removed, the two polysilicon sidewalls 100 are dangling and a vacancy 122 is thus formed at the bottom of the trench 52. In view of such process step, according to one embodiment of the present invention, a wet etching involving with buffer oxide etch (BOE) process, for instance, can be used so as to remove the gate oxide layer 90 at the trench bottom, such that the vacancy 122 is successfully formed at the bottom of the trench 52.

As a result, based on such structure as obtained in FIG. 11, as referring to the step of S316 in FIG. 3, the present invention is able to proceed to perform a thermal oxidation process such that a thick oxide layer can be formed after the two polysilicon sidewalls 100 are oxidized. Regarding such thermal oxidation process, taking one of the embodiments of the present invention as an example, the parameters and conditions for performing the proposed thermal oxidation process may comprise using oxygen ($O_2$), water molecule ($H_2O$), or a mixture of hydrogen ($H_2$) and oxygen ($O_2$) in the thermal oxidation process. Therefore, when such process is being applied to a silicon carbide substrate, it can be expected that, under the condition of such high-temperature thermal oxidation process, oxygen-containing molecules, such as water molecules ($H_2O$), will be advantageous for oxidizing the polysilicon sidewalls 100 such that the thick oxide layer ($SiO_2$) can be formed after the polysilicon sidewalls 100 are oxidized. Please refer to FIG. 12 at the same time. It is obvious that after the thermal oxidation process is complete, the polysilicon sidewalls 100 are consumed (volume of the polysilicon sidewalls 100 is reduced) so as to form the proposed thick oxide layer 200. According to the embodiment of the present invention, a thickness of the thick oxide layer 200 is between 0.1 μm and 0.5 μm. Preferably, the thickness of the thick oxide layer 200 can be 0.3 μm. In addition, as can be seen in the figure, the formed thick oxide layer 200 enfolds a periphery of the polysilicon sidewalls 100 and fills the previously described vacancy 122 at the bottom of the trench 52.

Generally, the thickness of the thick oxide layer 200 to be formed, can be controlled and determined according to various conditions of performing the foregoing thermal oxidation process, including: process temperature, oxidation time, and so on. Certain process flexibility is allowed and practical. It is worth emphasizing that, the present invention is definitely not limited to the above-mentioned thickness, dimensions or process parameters, including process temperature, process time, and reaction gas, etc. which were disclosed in the previously described embodiments. For people who are skilled in the art and with ordinary knowledge in the field, modifications without departing from the spirit of the present invention are permitted. However, within the scope of its equality, such modifications should still fall into the scope and claims of the present invention.

Figure 12:
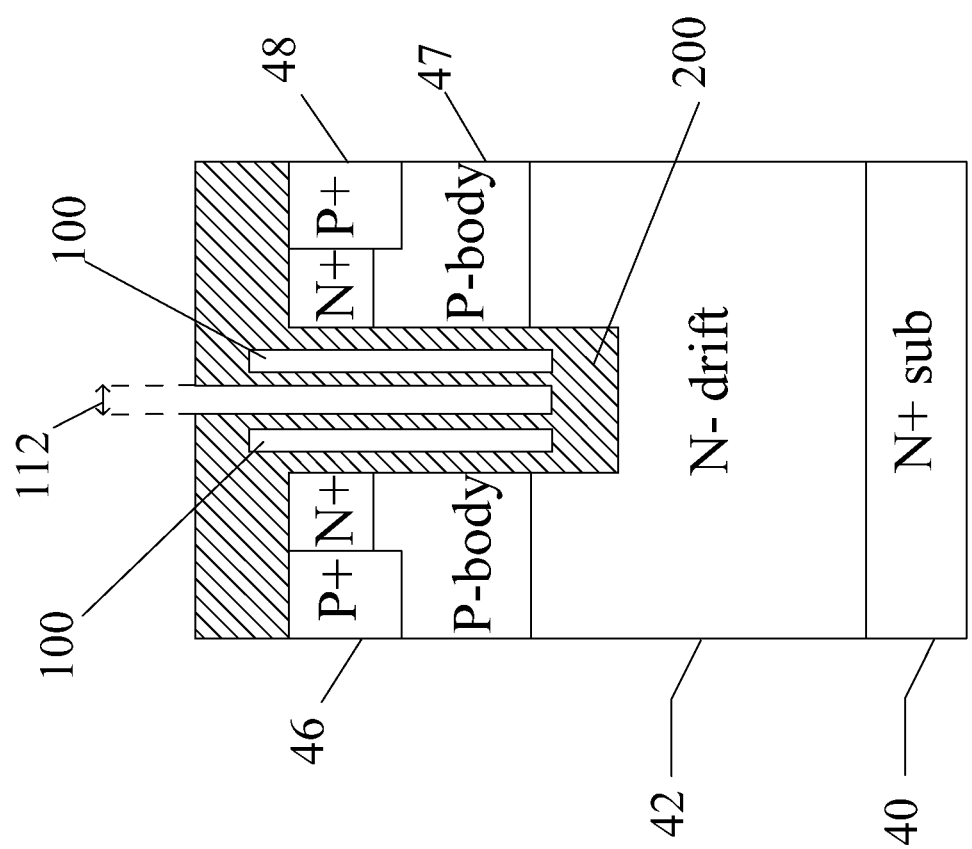
FIG. 12 shows a schematic structural diagram from FIG. 11, in which a thermal oxidation process is performed for forming and growing a thick oxide layer.

In details, according to the disclosed process techniques in the present invention, it is believed that during the foregoing thermal oxidation process is performed, a certain spacing can be optionally retained between the polysilicon sidewalls 100 which are enfolded by the thick oxide layer 200. As illustrated in FIG. 12 of the present invention, it is indicative that, the second spacing 112 is formed between the two polysilicon sidewalls 100 enfolded by the thick oxide layer 200, such that the trench 52 is only partially filled.

Based on such technical solutions proposed by the present invention, it is obvious that the trench is not completely filled with polysilicon but has a spacing in its central place. In other words, it is apparent that the polysilicon only exists along the trench sidewall (as the polysilicon sidewalls 100). Therefore, in proportional to a fully filled gate structure, the parasitic gate-drain capacitance $C_{GD}$ of the partially filled gate structure, can be reduced by 30% to 50% effectively.

Furthermore, according to an alternative embodiment of the present invention, then it is also applicable to continuing to perform the above-mentioned thermal oxidation process for continuing growing the thick oxide layer 200. Under such a circumstance, it can be obtained that the foregoing second spacing 112, as illustrated in FIG. 12, will be eventually vanished such that the trench is completely filled. As described earlier in the previous sections of the present invention, it is understood that the second spacing 112 is only required before the vacancy 122 at the bottom of the polysilicon sidewalls 100 is filled with the thick oxide layer 200. The disclosed thermal oxidation process can not be performed without the second spacing 112 since the oxygen-containing molecules must diffuse to the trench bottom for performing oxidation, depending on the second spacing 112. On the contrary, once the thick oxide layer 200 keeps growing and is thick enough to fill the vacancy 122 at the trench bottom, then it is also allowed to continue growing the thick oxide layer 200 such that the second spacing 112 is eventually vanished. The disclosed process method of the present invention is not limited thereto.

As a result, to sum up the technical contents of the present invention, it is believed that the Applicants of the present invention propose a gate fabrication method of an U-metal-oxide-semiconductor field-effect transistor (UMOSFET) and its trench gate structure formed thereof. By partially filling the gate structure with polysilicon and reducing an overlap area of the gate and drain electrodes, the parasitic gate-drain capacitance $C_{GD}$ can be significantly reduced. Apart form that, due to the oxidation process of the polysilicon sidewalls, it also achieves in increasing the oxide thickness at the bottom of the trench gate. Therefore, the trench corner curvature can be reduced as well. As a result, it is believed that when applying the technical solutions disclosed by the present invention to a power device which includes the UMOSFET structure, it is beneficial to improve and optimize its breakdown voltage and reliability.

Figure 10:
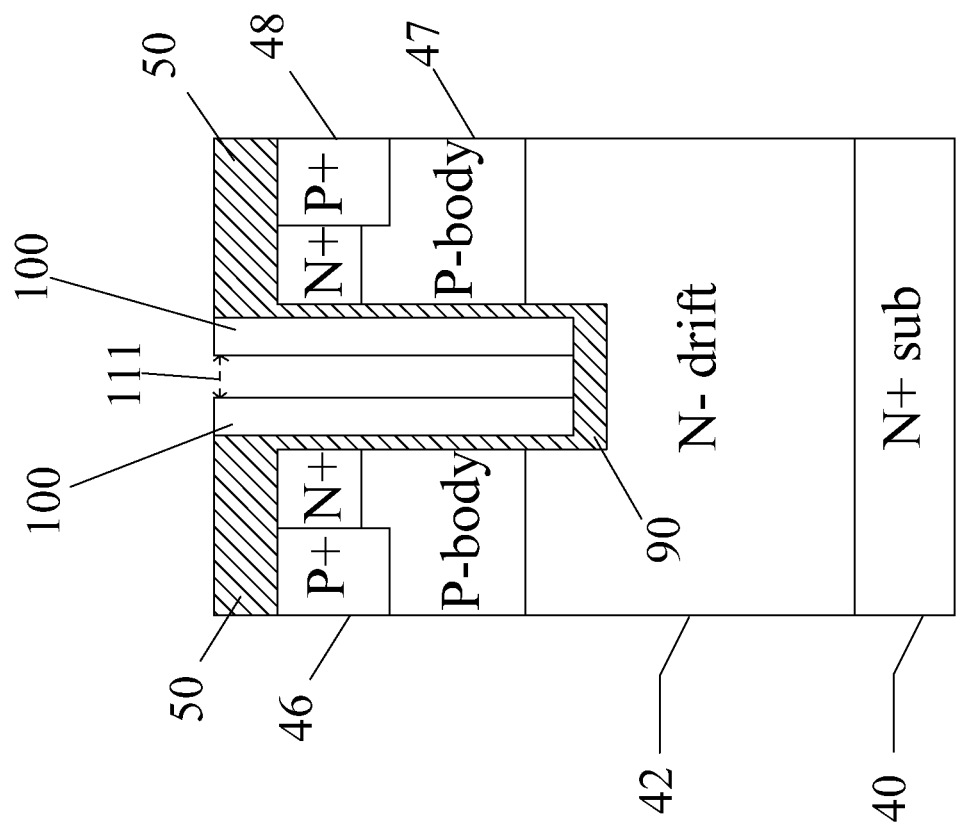
FIG. 10 shows a schematic structural diagram from FIG. 9, in which polysilicon sidewalls are further deposited and formed covering the gate oxide layer.
Figure 13:
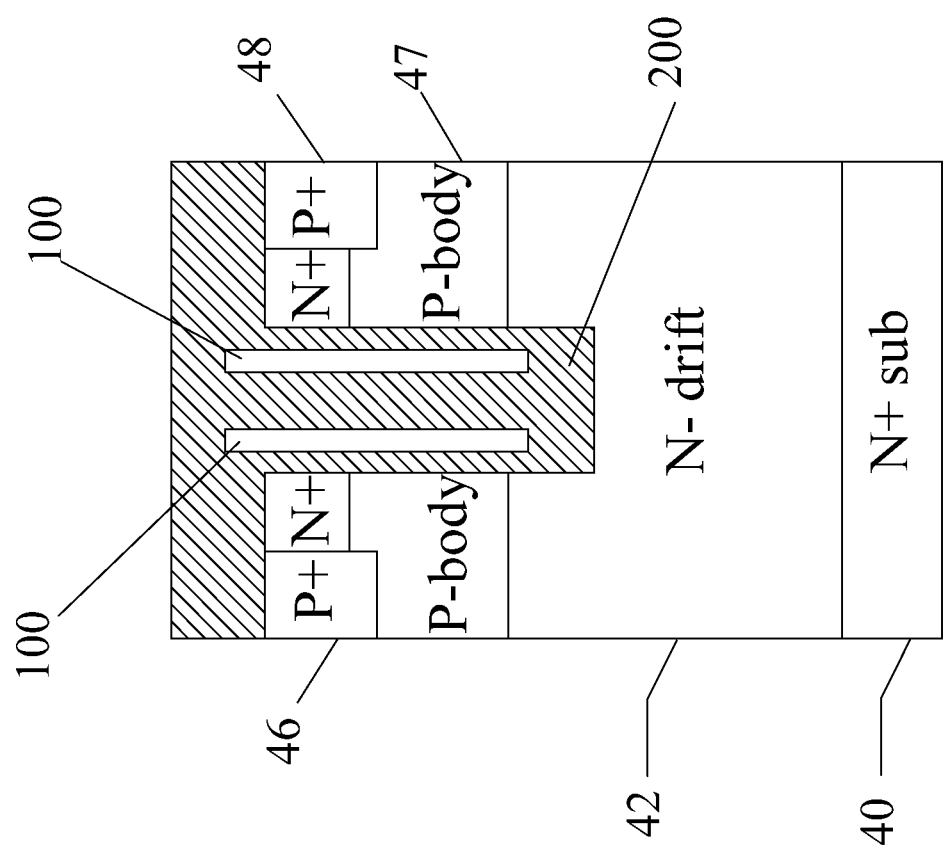
FIG. 13 shows a schematic structural diagram from FIG. 12, in which the thermal oxidation process is continued to perform such that the thick oxide layer continues to grow, and the trench is completely filled.

In view of the above-disclosed technical contents, it is ensured that the present invention provides an effective gate fabrication method of an U-metal-oxide-semiconductor field-effect transistor (UMOSFET) and its trench gate structure formed thereof. As indicated in FIG. 12 and FIG. 13 of the present invention, the trench gate structure formed by using the disclosed gate fabrication method comprises a trench gate and the thick oxide layer 200. The trench gate is formed in the trench 52, including the two polysilicon sidewalls 100, wherein the polysilicon only exists in the trench gate along its sidewalls. A spacing is retained in its central place. As illustrated in FIG. 10 of the present invention, it is indicative that a first spacing 111 exists between the two polysilicon sidewalls 100 before the thermal oxidation process is performed.

After that, through the vacancy 122 which was formed at the trench bottom as provided in FIG. 11 along with the thermal oxidation process as provided in FIG. 12 and FIG. 13, the disclosed thick oxide layer 200 is thus formed. As a matter of fact, the present invention achieves in fabricating the thick oxide layer 200, which enfolds the periphery of the two polysilicon sidewalls 100 and fills the vacancy 122 at the bottom of the trench. In addition, according to one embodiment of the present invention, it is feasible to retain the second spacing 112 (the width of the second spacing 112 is less than the width of the first spacing 111) between the two polysilicon sidewalls 100 enfolded by the thick oxide layer 200 as described in the FIG. 12 embodiment, such that the trench is partially filled. Alternatively, according to another embodiment of the present invention, it is also practical to continue to perform the thermal oxidation process for continuing growing the thick oxide layer 200, as described in the FIG. 13 embodiment. In such an alternative embodiment, then the second spacing 112 will be eventually vanished as the growing thick oxide layer 200 and the trench will be completely filled. The inventive effects of the present invention can be accomplished by employing the process methods as disclosed in the present invention in view of the various trench gate structures.

Moreover, regarding the trench gate structures formed by using the gate fabrication method of the present invention, it is believed that a thickness of the polysilicon sidewall 100 should be less than half a width of the trench. For example, in one applicable embodiment of the present invention, a thickness of the polysilicon sidewall 100 can be between 0.2 μm and 1.0 μm. The formed thick oxide layer 200 may have a thickness between 0.1 μm and 0.5 μm. Preferably, the thickness of the thick oxide layer 200 can be 0.3 μm.

As a result, it can be expected that by employing the disclosed technical contents and features of the present invention, the proposed process method and formed structure are beneficial to 1. increasing the oxide thickness at the bottom of the gate, 2. reducing trench corner curvature, and 3. decreasing the conventional parasitic gate-drain capacitance $C_{GD}$.

As for a plurality of post end process after the trench gate structure is formed, those having ordinary knowledge backgrounds and skilled in the art are allowed to proceed subsequent processes, on the basis of the gate structure of the present invention according to their actual requirements, including for instance: depositing a dielectric layer on the gate metal layer (dielectric deposition), defining and etching at least one metal contact window, metal deposition, metal etching, and so on. Since these post end processes are basically the same as they are performed in the current processes of the UMOSFETs, the present invention is therefore not repeated here in after and not intended to provide detailed descriptions. Overall, what is important lies in, the inventive spirit of the present invention focuses on how to increase the gate oxide thickness at the trench bottom of the UMOSFET. Therefore, by designing and fabricating the trench gate which is not completely filled with the polysilicon (but partially), it is effective to reduce the parasitic gate-drain capacitance $C_{GD}$ significantly. Based on such technical contents, by employing the process method as disclosed in the present invention, not only the thickness of the oxide layer at the bottom of the gate can be increased, but at the same time, the conventional electric field enhancement and crowding effect at the corner of the trench and various problems derived therefrom are eliminated.

Figure 14:
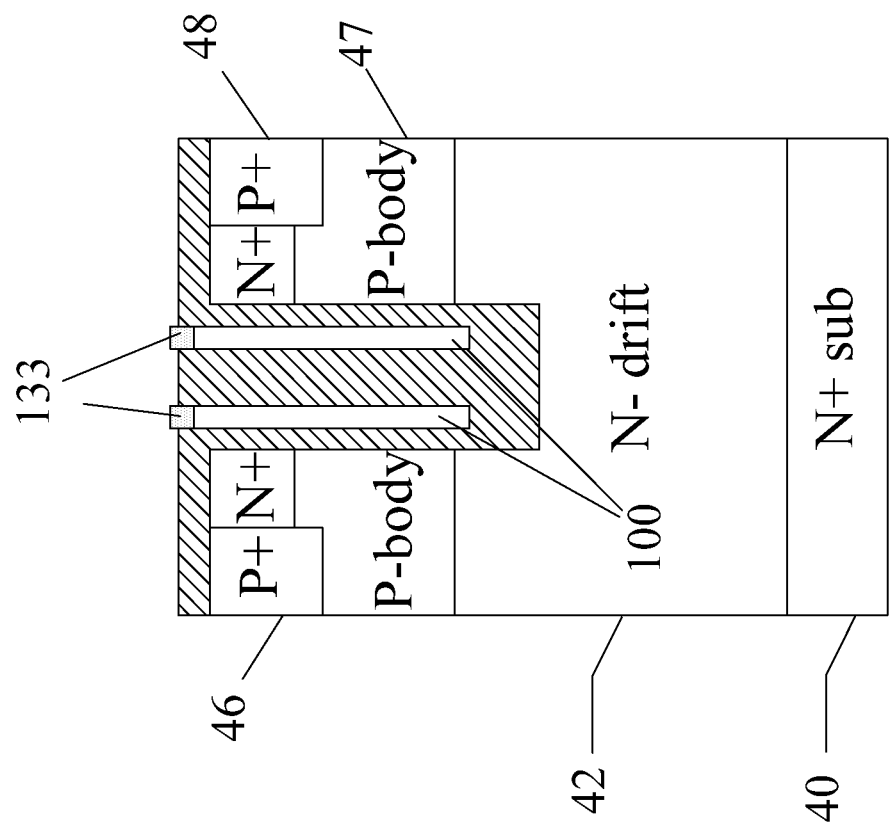
FIG. 14 shows a schematic structural diagram, in which annealing process is employed to form the metal silicide for the purpose of reducing the gate resistance.

On the other hand, regarding a trench gate structure which is merely partially filled with the polysilicon, since it is known that its gate resistance is more likely to be increased when compared to a conventional gate structure which is completely filled with the polysilicon, the Applicants of the present invention also provide and propose corresponding modifications. Please find the solutions as illustrated in the drawing of FIG. 14 of the present invention. It can be found that: after the trench is filled with silicon dioxide (the slashed area illustrated in the figure), an etching back process is used to expose the top of the polysilicon sidewall 100. And afterwards, metal deposition and annealing process are successively performed such that the metal silicide 133 as illustrated in the figure can be formed. As a result, by adopting such technical manners in this way, it is asserted that the deficiency of an increased gate resistance can be effectively solved.

Besides, according to the process method disclosed in the present invention, its application field is certainly not limited to the N-type silicon carbide substrate but can also be widely applied to a variety of semiconductor substrates, including transistors with an N-type channel or a P-type channel. Among the technical contents, it is believed that the semiconductor substrate, the drift region and the first heavily doped region disclosed in the present invention have a first semiconductor type. The second heavily doped region, the third heavily doped region and the body region disclosed in the present invention have a second semiconductor type, and the first semiconductor type and the second semiconductor type are opposite conductivity types. In other words, according to one embodiment of the present invention, when the first semiconductor type is N type, the second semiconductor type will be P type. And in an alternative embodiment of the present invention, when the first semiconductor type is P type, then the second semiconductor type will be N type. The above-mentioned first and second semiconductor types are not intended to limit the claim scopes of the invention. Moreover, the present invention is also not limited by the above-mentioned process layouts (N-channel or P-channel) as described in the descriptions. In other words, those skilled in the art are able to make equivalent modifications and variations based on the actual product specifications without departing from the spirits of the invention. Nevertheless, such modified embodiments should still fall within the claim scope of the present invention.

In a further aspect, when applying the disclosed process method and its trench gate structure formed thereof the present invention, it is believed that its application field is not limited to the foregoing UMOSFETs. According to the variant embodiments of the present invention, it can alternatively be further widely applied to any power device which includes the UMOSFET structure, for example, an Insulated Gate Bipolar Transistor (IGBT). From this point of view, it is obvious that when compared with the prior arts, the present invention is characterized by having better industrial compatibility and wider application than the prior arts.

As a result, to sum above, as compared with the prior arts, it is asserted that through the embodiments and the process method disclosed in the present invention, the electric field strength in the oxide layer can be effectively reduced under the same voltage. The breakdown voltage of the device can be increased, and the gate-drain capacitance can be reduced. The present invention is both innovative and practical. In addition, the present invention can also effectively solve the electric field enhancement and crowding effect occurring at the trench corners on both sides of the trench bottom, thereby avoiding the existing deficiencies in the prior arts. Also, in addition to the silicon carbide substrates, a plurality of various substrates made of other semiconductor materials, such as silicon (Si), gallium oxide ($Ga_2O_3$), aluminum nitride (AlN), and diamond, etc. are applicable as well. Therefore, as a matter of fact, the Applicants assert that the present invention is instinct, effective and highly competitive for the incoming technologies, industries and researches developed in the future. And since the technical features, means and effects achieved by the present invention are significantly different from the current solutions and can not be accomplished easily by those who are familiar with the industry, it is thus believed that the present invention is indeed characterized by patentability and shall be patentable soon in a near future.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. A gate fabrication method of an U-metal-oxide-semiconductor field-effect transistor (UMOSFET), comprising:
   providing a semiconductor substrate and forming a drift region on the semiconductor substrate;
   forming a first heavily doped region in the drift region;
   forming a second heavily doped region and a third heavily doped region respectively on opposite sides of the first heavily doped region, and providing a body region between the first heavily doped region, the second heavily doped region, the third heavily doped region and the drift region;
   depositing a hard mask layer on the first heavily doped region, the second heavily doped region and the third heavily doped region, and using a lithography process to form a trench;
   depositing a gate oxide layer along the trench, such that the gate oxide layer covers at least two opposite sidewalls and a bottom of the trench;
   forming two polysilicon sidewalls on the two opposite sidewalls of the trench, wherein the two polysilicon sidewalls cover the gate oxide layer on the two opposite sidewalls and cover the gate oxide layer on the bottom of the trench, each of the two polysilicon sidewalls is disposed corresponding to each of the two opposite sidewalls of the trench, and a first spacing is formed between the two polysilicon sidewalls;

removing the gate oxide layer underneath the two polysilicon sidewalls such that the two polysilicon sidewalls are dangling and a vacancy is formed at the bottom of the trench; and performing a thermal oxidation process such that a thick oxide layer is formed after the two polysilicon sidewalls are oxidized, wherein the thick oxide layer enfolds a periphery of the two polysilicon sidewalls and fills the vacancy at the bottom of the trench, and a second spacing is formed between the two polysilicon sidewalls enfolded by the thick oxide layer such that the trench is partially filled.

2. The gate fabrication method of an U-metal-oxide-semiconductor field-effect transistor (UMOSFET) of claim 1, wherein the semiconductor substrate, the drift region and the first heavily doped region have a first semiconductor type, the second heavily doped region, the third heavily doped region and the body region have a second semiconductor type, and the first semiconductor type and the second semiconductor type are opposite conductivity types.

3. The gate fabrication method of an U-metal-oxide-semiconductor field-effect transistor (UMOSFET) of claim 1, wherein the semiconductor substrate is made of silicon (Si), silicon carbide (SiC), gallium oxide ($Ga_2O_3$), aluminum nitride (AlN), or diamond.

4. The gate fabrication method of an U-metal-oxide-semiconductor field-effect transistor (UMOSFET) of claim 1, further comprising using a source ion implantation process to form the first heavily doped region in the drift region.

5. The gate fabrication method of an U-metal-oxide-semiconductor field-effect transistor (UMOSFET) of claim 1, wherein the hard mask layer is made of silicon dioxide ($SiO_2$).

6. The gate fabrication method of an U-metal-oxide-semiconductor field-effect transistor (UMOSFET) of claim 1, wherein the trench extends through the first heavily doped region and the body region, and the bottom of the trench ends in the drift region.

7. The gate fabrication method of an U-metal-oxide-semiconductor field-effect transistor (UMOSFET) of claim 1, further comprising using a plasma enhanced chemical vapor deposition (PECVD) process to deposit the gate oxide layer.

8. The gate fabrication method of an U-metal-oxide-semiconductor field-effect transistor (UMOSFET) of claim 7, wherein a thickness of the gate oxide layer which covers the bottom of the trench is twice as thick as a thickness of the gate oxide layer which covers one of the two opposite sidewalls of the trench.

9. The gate fabrication method of an U-metal-oxide-semiconductor field-effect transistor (UMOSFET) of claim 1, wherein in the step of forming the two polysilicon sidewalls further comprises:

using a low-pressure chemical vapor deposition (LPCVD) process to deposit a polysilicon; and using an anisotropic etching process to etch the polysilicon so as to form the two polysilicon sidewalls having the first spacing there in between.

10. The gate fabrication method of an U-metal-oxide-semiconductor field-effect transistor (UMOSFET) of claim 1, wherein a thickness of one of the two polysilicon sidewalls is less than half a width of the trench.

11. The gate fabrication method of an U-metal-oxide-semiconductor field-effect transistor (UMOSFET) of claim 1, wherein a thickness of one of the two polysilicon sidewalls is between 0.2 µm and 1.0 µm.

12. The gate fabrication method of an U-metal-oxide-semiconductor field-effect transistor (UMOSFET) of claim 1, further comprising using a wet etching involving with buffer oxide etch (BOE) process to remove the gate oxide layer underneath the two polysilicon sidewalls such that the vacancy is formed at the bottom of the trench.

13. The gate fabrication method of an U-metal-oxide-semiconductor field-effect transistor (UMOSFET) of claim 1, wherein a thickness of the thick oxide layer is between 0.1 µm and 0.5 µm.

14. The gate fabrication method of an U-metal-oxide-semiconductor field-effect transistor (UMOSFET) of claim 1, wherein oxygen ($O_2$), water molecule ($H_2O$), or a mixture of hydrogen ($H_2$) and oxygen ($O_2$) is used in the thermal oxidation process.

15. The gate fabrication method of an U-metal-oxide-semiconductor field-effect transistor (UMOSFET) of claim 1, wherein a width of the second spacing is less than that of the first spacing.

16. The gate fabrication method of an U-metal-oxide-semiconductor field-effect transistor (UMOSFET) of claim 1, further comprising continuing to perform the thermal oxidation process for growing the thick oxide layer such that the second spacing is vanished and the trench is completely filled.

17. A trench gate structure formed by using the gate fabrication method of an U-metal-oxide-semiconductor field-effect transistor (UMOSFET) of claim 1, comprising:

a trench gate formed in the trench, wherein the trench gate includes the two polysilicon sidewalls, and the first spacing exists between the two polysilicon sidewalls before the thermal oxidation process is performed; and the thick oxide layer, which enfolds the periphery of the two polysilicon sidewalls and fills the bottom of the trench, wherein the second spacing exists between the two polysilicon sidewalls enfolded by the thick oxide layer such that the trench is partially filled.

18. The trench gate structure formed by using the gate fabrication method of an U-metal-oxide-semiconductor field-effect transistor (UMOSFET) of claim 17, wherein a thickness of one of the two polysilicon sidewalls is less than half a width of the trench.

19. The trench gate structure formed by using the gate fabrication method of an U-metal-oxide-semiconductor field-effect transistor (UMOSFET) of claim 17, wherein a thickness of one of the two polysilicon sidewalls is between 0.2 µm and 1.0 µm.

20. The trench gate structure formed by using the gate fabrication method of an U-metal-oxide-semiconductor field-effect transistor (UMOSFET) of claim 17, wherein a thickness of the thick oxide layer is between 0.1 µm and 0.5 µm.

21. The trench gate structure formed by using the gate fabrication method of an U-metal-oxide-semiconductor field-effect transistor (UMOSFET) of claim 17, wherein a width of the second spacing is less than that of the first spacing.

22. The trench gate structure formed by using the gate fabrication method of an U-metal-oxide-semiconductor field-effect transistor (UMOSFET) of claim 17, wherein the thick oxide layer is further formed by continuing to perform the thermal oxidation process such that the second spacing is vanished and the trench is completely filled.

* * * * *